United States Patent

Sato et al.

[11] Patent Number: 5,940,274
[45] Date of Patent: *Aug. 17, 1999

[54] CASING FOR COMPUTER AND COMPUTER EMPLOYING THE SAME CASING WITH REMOVABLE REAR CABLE COVER

[75] Inventors: Yoko Sato, Tachikawa; Takashi Yamamoto, Kodaira; Tohru Higashihara, Sayama; Hideki Iwao, Nagoya; Ichirou Asano, Seto, all of Japan

[73] Assignee: Hitachi, Ltd., Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/796,037
[22] Filed: Feb. 5, 1997

[30] Foreign Application Priority Data

Feb. 5, 1996 [JP] Japan .................................. 8-019114

[51] Int. Cl.⁶ .................................. G06F 1/16; H05K 5/02
[52] U.S. Cl. ........................ 361/725; 361/683; 312/223.2
[58] Field of Search .................................. 361/683–687, 361/724–730, 735, 736; 312/223.1, 223.2; 364/708.1; G06F 1/16

[56] References Cited

U.S. PATENT DOCUMENTS 4,996,628 2/1991 Harvey et al. ........................ 361/735
5,515,239 5/1996 Kamerman et al. .................... 361/727
5,602,721 2/1997 Slade et al. ............................ 361/727
5,604,662 2/1997 Anderson et al. ...................... 361/685
5,737,189 4/1998 Kammersgard et al. ............... 361/726

FOREIGN PATENT DOCUMENTS 6-259167 9/1994 Japan .

Primary Examiner—Lynn D. Feild
Attorney, Agent, or Firm—Antonelli, Terry, Stout & Kraus, LLP

[57] ABSTRACT

A casing is intended to meet various requirements of a computer network system, reduce the cost of a computer network system, enable the enhancement of a computer network system after installation, and secure desired functions and reliability of a computer network system for a long period of use. The casing is constructed by stacking a plurality of types of subordinate casings (2, 3) differing from each other in height on a base (4). Each of the subordinate casings (2, 3) is provided with an individual front cover (5), and common signal lines on its rear surface having removable rear cable covers on the rear surface. The subordinate casings (2, 3) contain general-purpose electronic devices, such as a personal computer, a workstation, an extension disk/disk array, an integrated communication server (ICS), an uninterruptible power supply and the like, respectively. The functional devices are interconnected by signal lines extended on the rear surface of the casing to construct a system.

24 Claims, 14 Drawing Sheets

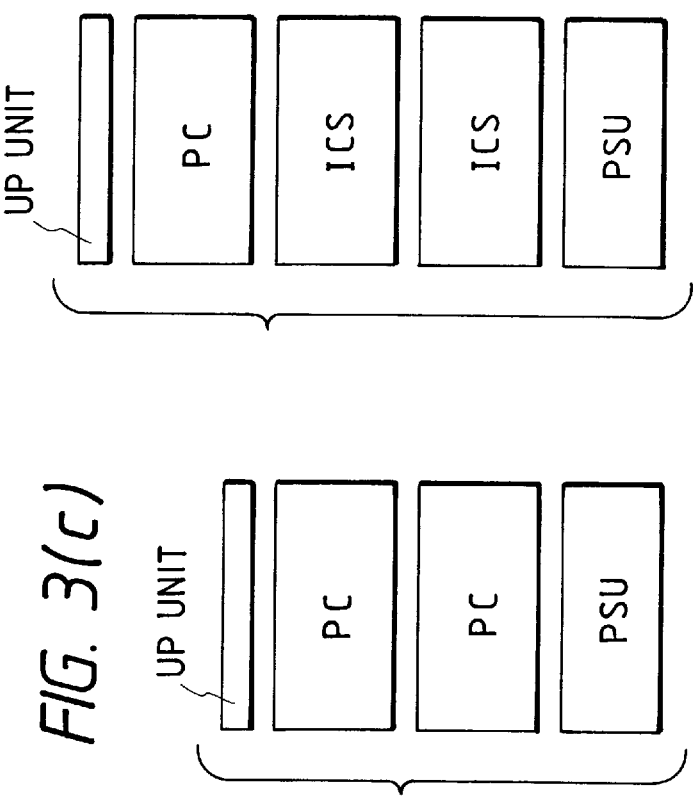
FIG. 3(d)
FIG. 3(c)
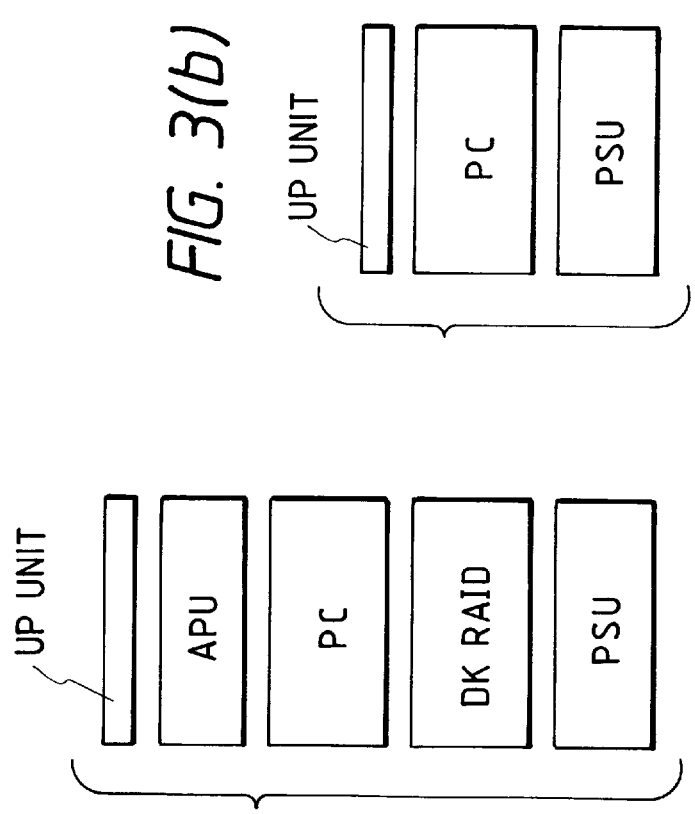
FIG. 3(b)
FIG. 3(a)

CASING FOR COMPUTER AND COMPUTER EMPLOYING THE SAME CASING WITH REMOVABLE REAR CABLE COVER

BACKGROUND OF THE INVENTION

The present invention relates to a casing for a computer, and a computer employing the casing. More particularly, the present invention relates to a casing for a computer designed according to the user needs and comprising, in an optional combination, existing personal computers, workstations, file storage units including disk devices, communication devices for communication with external devices, and functional devices including an uninterruptible power supply.

As mentioned above, the computer designed by the user needs a case designed in order to contain the functional devices of the computer network system according to the purposes of the computer network system. A casing intended for containing such functional devices and proposed in, for example, JP-A No. 6-259167 is a rack type casing comprising an upper unit, a lower unit and device units. The number of the device units is changed according to the configuration of the computer network system.

SUMMARY OF THE INVENTION

This previously proposed casing is capable of dealing with different computer network systems of different configurations because the number of the device units can be changed according to the configuration of a computer network system so that all the functional devices of the computer network system including existing personal computers, work-stations, file storage devices, a communication device and an uninterruptible power supply can be housed therein and can be integrated to construct the computer network system.

It is an object of the present invention to provide a casing capable of containing the components of a computer designed according to user's options.

Another object of the present invention is to provide a computer designed according to user's options, comprising component elements contained in a casing capable of containing the component elements with style so that the computer network system can be operated in the presence of customers, capable of dealing with various requirements, of being manufactured at a low cost, of enabling easy functional updating of the computer network system after installation, and of securing desired functions and reliability for a long time of use.

BRIEF DESCRIPTION OF THE DRAWINGS

FIGS. 3(a), 3(b), 3(c) and 3(d) are block diagrams of different combinations of functional devices to be contained in casings in accordance with the present invention;

DETAILED DESCRIPTION OF THE PREFERRED EMBODIMENTS

Computer network system in preferred embodiments according to the present invention will be described with reference to the accompanying drawings.

Figure 1:
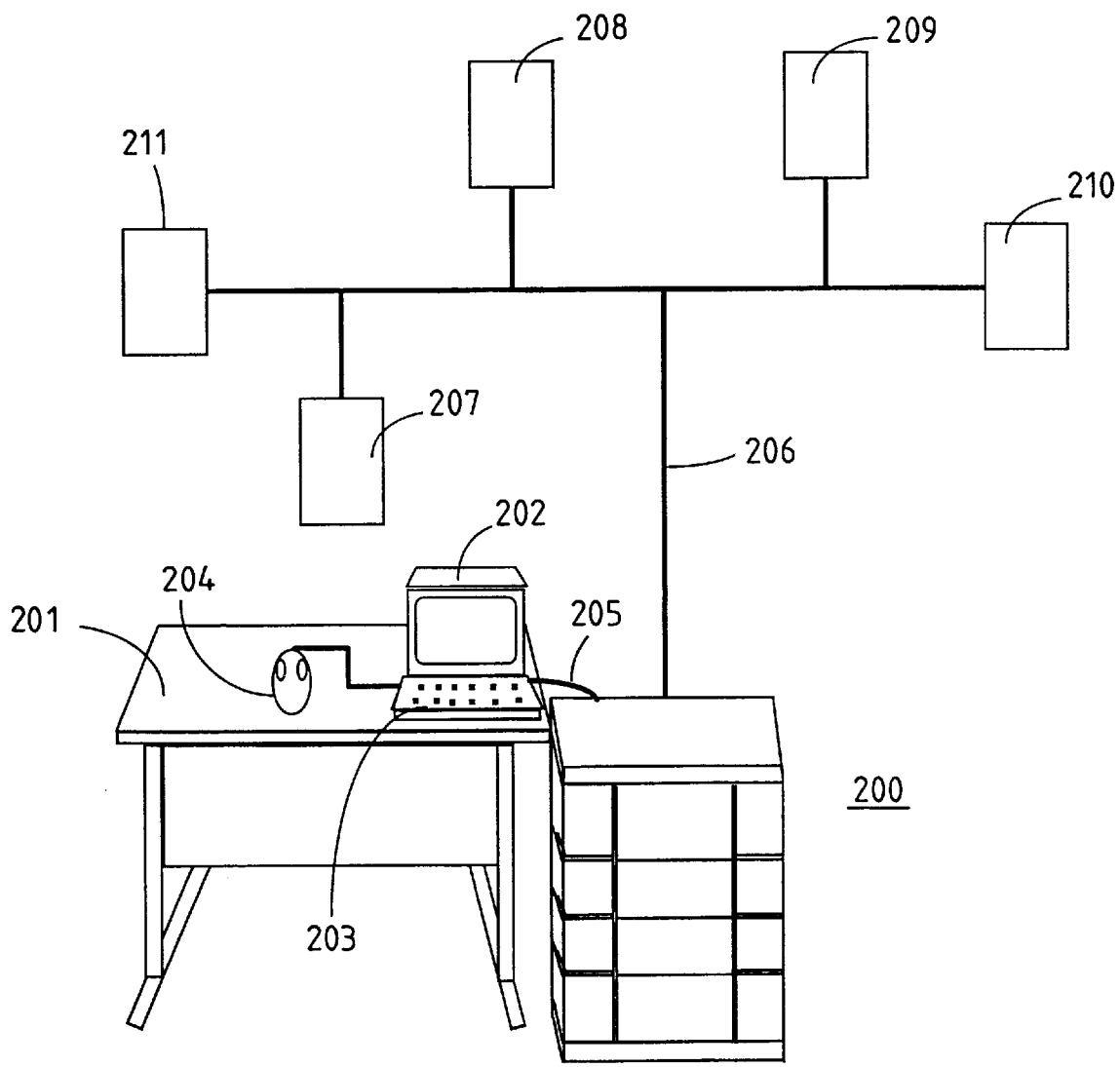
FIG. 1 is a block diagram of a computer network system employing a casing in accordance with the present invention.

FIG. 1 is a block diagram of a computer network system employing a casing in accordance with the present invention;

Referring to FIG. 1, a computer network system is constructed by connecting clients 207, 208, 209, 210 and 211 to functional devices including a file storage device and housed in a casing 200 by a network 206. A desk 201 for an operator who controls the computer network system is disposed near the casing 200. Arranged on the desk 201 are a display 202, a keyboard 203 and a mouse 204 for operating an operator's personal computer. The operator's personal computer is one of functional devices housed in the casing 200. The display 202 and the keyboard 203 are connected to the operator's personal computer by a cable 205.

Although the clients 207, 208, 209, 210 and 211 of the computer network system, similarly to those of general computer network systems, are operated individually, the computer network system is operated and controlled by an operator who operates the personal computer through the operation of the display 202, the keyboard 203 and the mouse 204.

Figure 2:
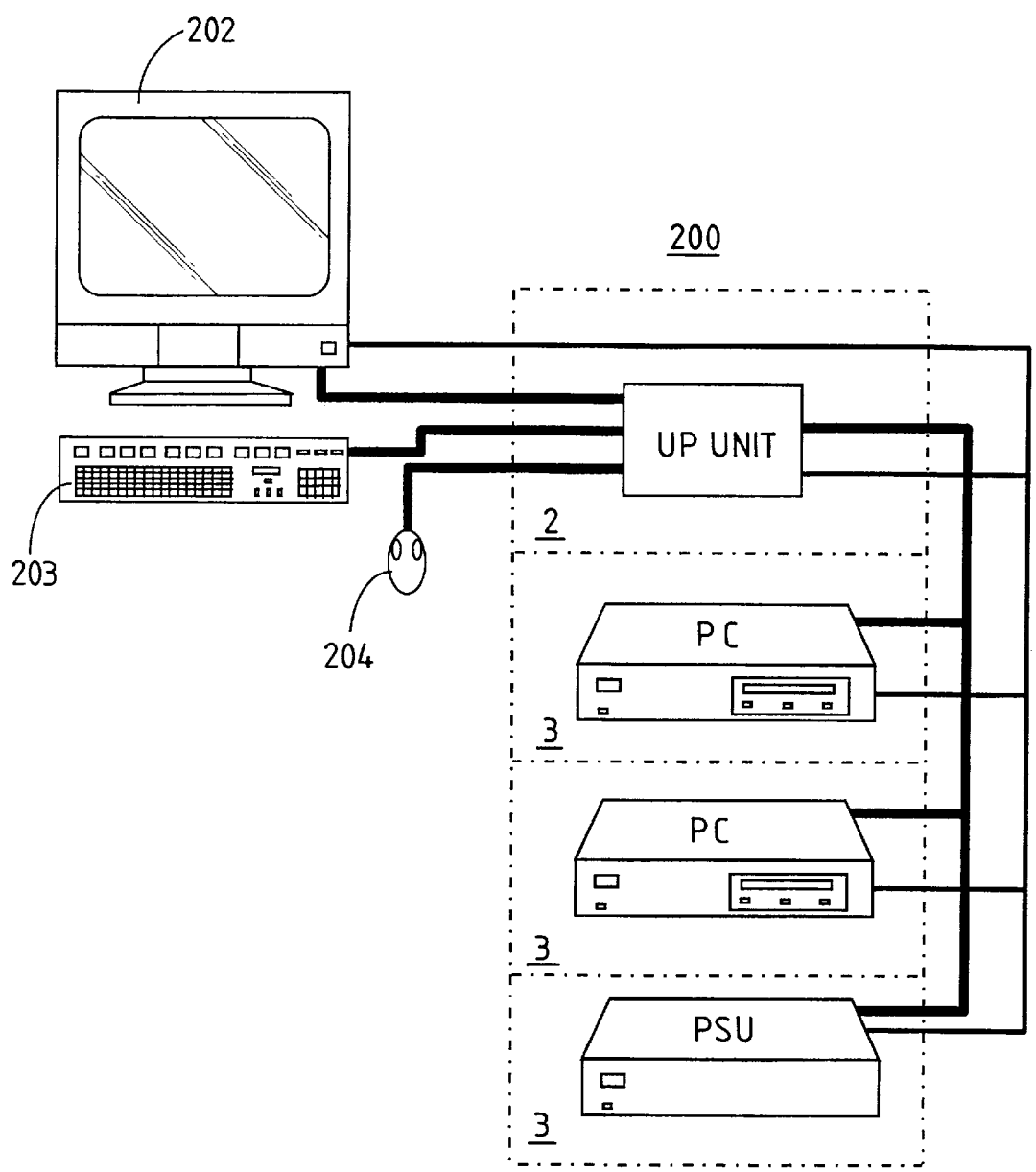
FIG. 2 is a pictorial block diagram showing functional blocks of a computer network system employing a casing in accordance with the present invention.
Figure 4:
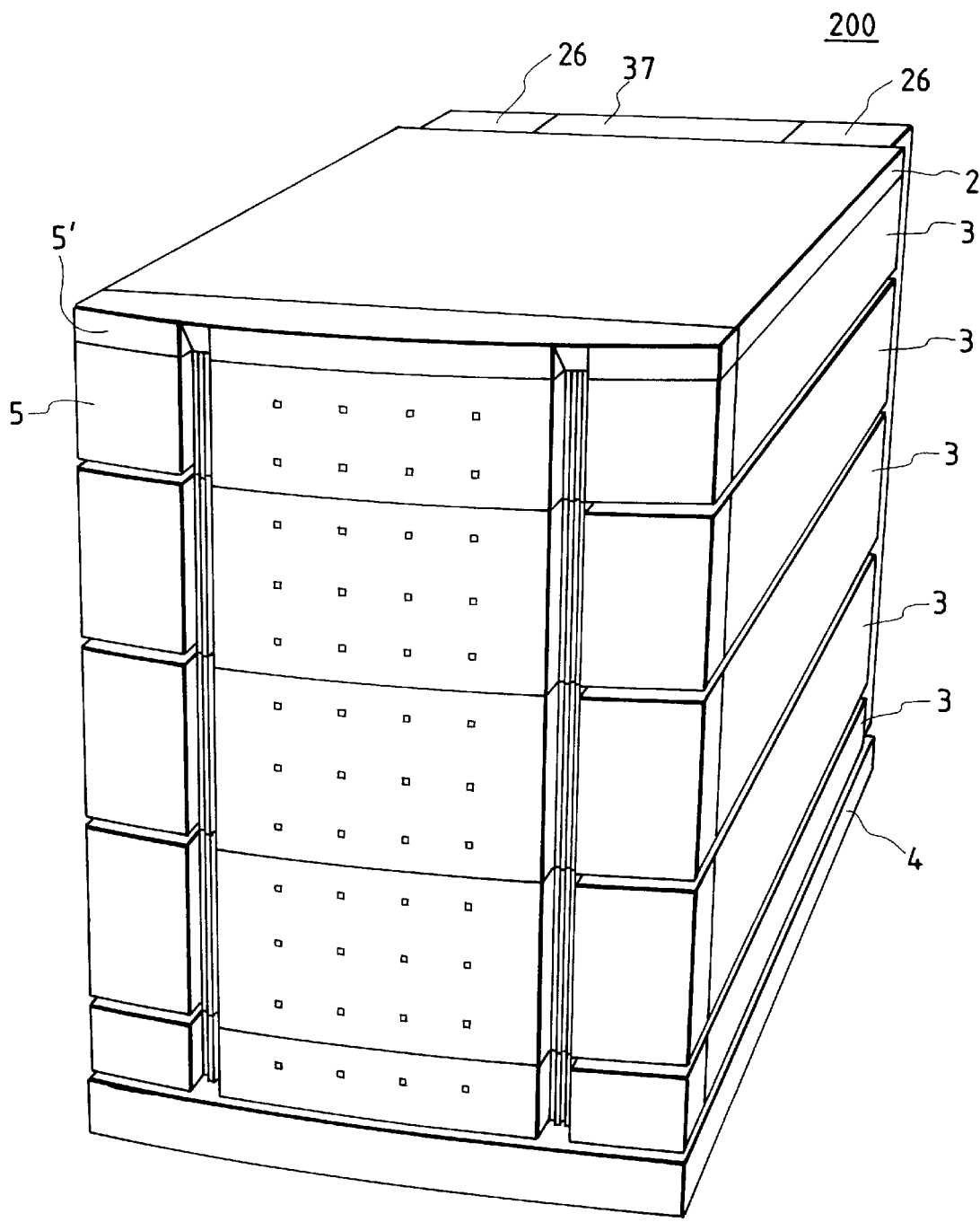
FIG. 4 is a perspective view of one of many configurations of present invention and its casing.

FIG. 2 is a block diagram of assistance in explaining the functions of a personal computer network system employing a casing in accordance with the present invention. The personal computer network system shown in FIG. 2, differing from the computer network system shown in FIG. 1, has a configuration similar to that of an ordinary personal computer, and has a duplex main unit that improves the reliability of the personal computer network system. A display 202, a keyboard 203 and a mouse 204 are connected by signal lines indicated by thick lines to an UP unit, i.e., a functional device, contained in a top subordinate casing of a casing 200. Two personal computers PC, i.e., functional devices, are contained in two adjacent subordinate casings of the casing 200. The two personal computers PC are of the same configuration and capable of operating individually. However, in this personal computer network system, the personal computers PC are operated so that one of the two personal computers PC follows the operation of the other. One of the two personal computers PC is specified as a principal personal computer PC and the other is specified as a subordinate personal computer PC by giving signals to an internal microcomputer included in the UP unit contained in the top subordinate casing. Upon the detection of an abnormality in one of the personal computers PC, the internal microcomputer of the UP unit gives a switching signal to switch the circuit from the abnormal personal computer PC to the other personal computer PC. Therefore, the work using the personal computer PC is not obstructed at all. A PSU, i.e., a functional device, is contained in a bottom subordinate casing of the casing 200. The PSU is provided with, for example, an uninterruptible power supply through which power is supplied to the UP unit and the personal computers PC. Also contained in the bottom subordinate casing is a general-purpose uninterruptible power supply including a battery and an inverter, for supplying power to all the components of the personal computer network system, and a system controller which executes a system terminating procedure if the commercial power source is disconnected from the personal computer network system and is not connected in a predetermined time (a time for which the battery is able to supply power), and executes a system starting procedure for starting the personal computer network system upon the connection of the commercial power source to the personal computer network system after the disconnection of the same. The operation of the general-purpose uninterruptible power supply is controlled by an on- and an off-signal given by the operator to the microcomputer. The system controller may be a very simple microcomputer. The system controller can easily be constructed by arranging necessary parts on a printed wiring board provided with necessary circuit patterns and, therefore, the height of the top subordinate casing may be smaller than those of the other subordinate casings as shown in FIG. 4.

In the computer network system, the personal computers PC and the internal microcomputer of the UP unit exchange information through a common data bus. Therefore, the rear side of the casing is not jammed with heaps of wiring lines, which occurs in a computer network system comprising general personal computers.

FIGS. 3(a), 3(b), 3(c) and 3(d) are block diagrams of different combinations of functional devices to be contained in casings 200 in accordance with the present invention constructed by stacking up a plurality of types of subordinate casings 2 and 3 differing from each other in height on a bottom case 4.

In any one of the casings 200, the functional device contained in the top subordinate casing is an UP unit including a microcomputer as shown in FIG. 2, the functional device contained in the bottom subordinate casing is a PSU provided with an uninterruptible power supply, and various functional devices essential to the computer network system are contained in subordinate casings lying between the top and the bottom subordinate casing. A computer network system shown in FIG. 3(a) is a file server comprising an APU, a personal computer PC and an extension disk/disk-array DK RAID. A computer network system shown in FIG. 3(b) is an AP server comprising only a personal computer PC. A computer network system shown in FIG. 3(c) is a duplex center backup system comprising two personal computers PC. One of the two personal computers PC is kept on standby. A computer network system shown in FIG. 3(d) is an unmanned automatic monitoring system comprising a personal computer PC and two terminal connecting devices ICS (integrated communication servers).

As is apparent from those systems shown in FIGS. 3(a) to 3(d), the height of the casing is dependent on the component functional devices of the computer network system. However, the respective heights of the top and the bottom subordinate casing respectively containing the UP unit including a microcomputer and the PSU provided with the uninterruptible power supply are the same for different computer network systems. Most user's requirements can be met by subordinate casings of a limited number of types differing in height to be disposed between the top and the bottom subordinate casing. Naturally, the necessary functions of the microcomputer included in the UP unit and the output capacity of the uninterruptible power supply incorporated into the PSU need to be changed according to the characteristics of the computer network system and the component functional devices of the former. However, the functions of the microcomputer can be changed through the change of the software to be executed by the microcomputer, the requirements of the uninterruptible power supply including output capacity and required by the computer network systems of this kind can be satisfied by the general-purpose uninterruptible power supply and, therefore, the height of the subordinate casing for containing the PSU is not dependent on the requirements of the uninterruptible power supply.

The dimensions of the subordinate casings 2 and 3 are determined according to the dimensions of functional devices (electronic devices) to be contained therein. Since the dimensions of most of these functional devices are determined on the basis of de facto standards, all the casings for different purposes can be constructed by subordinate casings of only several different sizes. The dimensions of the subordinate casings may be determined on the basis of the dimensions of general-purpose electronic devices so as to be able to contain such general-purpose electronic devices. Generally, subordinate casings of 19" in outside width and 20" to 32" in outside depth are suitable for containing general-purpose electronic deices. The height of the subordinate casings is an integral multiple of a minimum standard height. The respective heights of the component subordinate casings of the casing in accordance with the present invention are determined so as to conform to the dimensions of electronic devices to be contained therein. It is recommended that the height of the subordinate casing is an integral multiple of a standard height of 25 mm or 50 mm.

Figure 5:
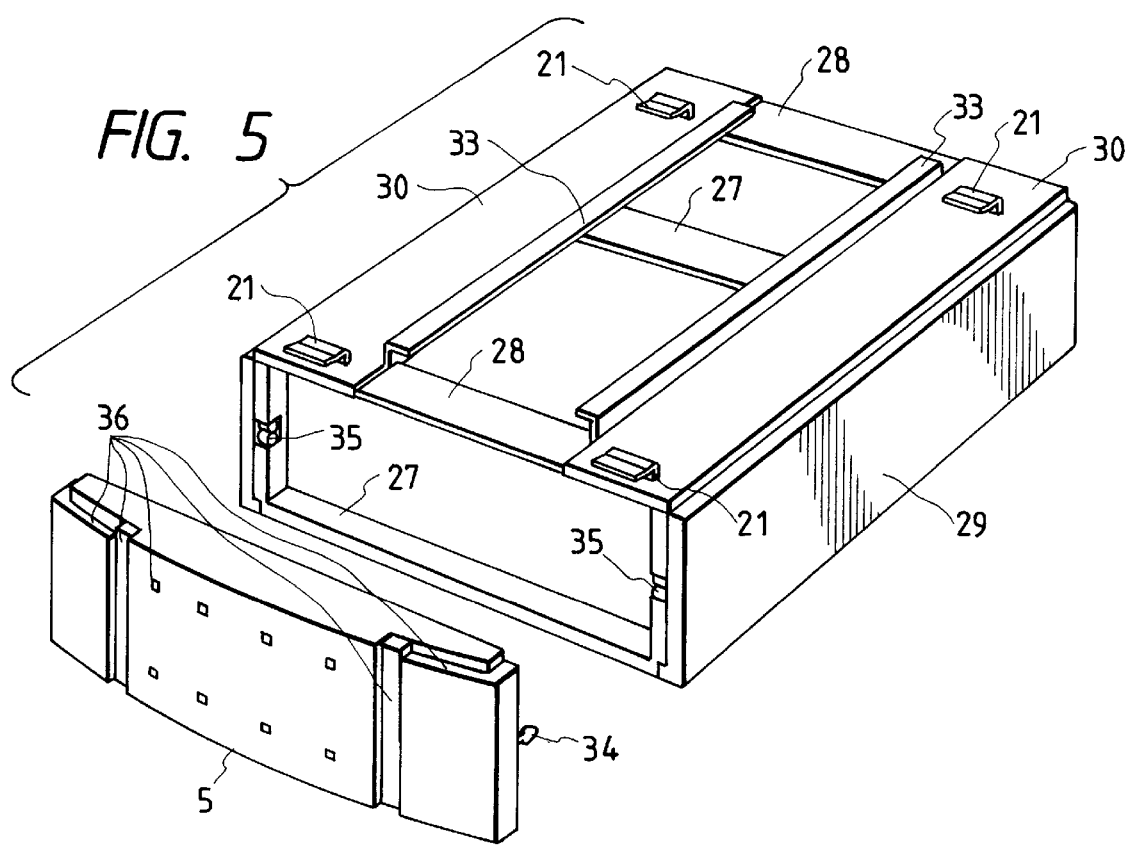
FIG. 5 is a perspective bottom view of one of a plurality of subordinate casings included in the casing of FIG. 4.
Figure 6:
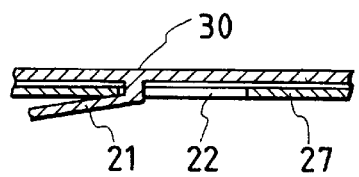
FIG. 6 is a fragmentary sectional view of a connecting structure, by way of an example, for connecting the plurality of subordinate casings of the casing of FIG. 4.
Figure 7:
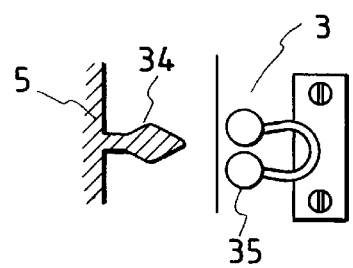
FIG. 7 is a side view of a latch mechanism for latching the front cover of the subordinate casing of the casing of FIG. 4.
Figure 8:
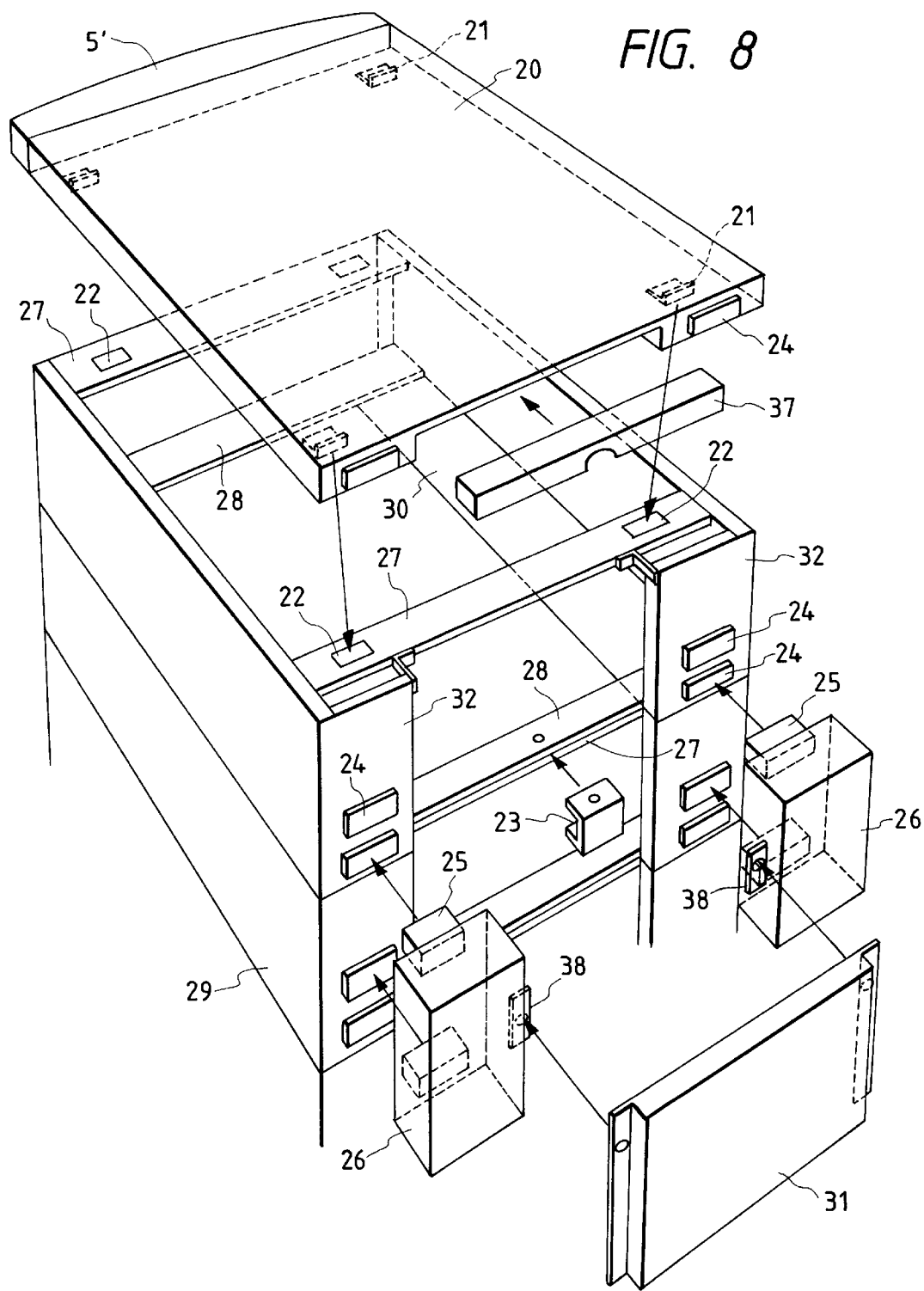
FIG. 8 is an exploded perspective rear view of the casing of FIG. 4.
Figure 9:
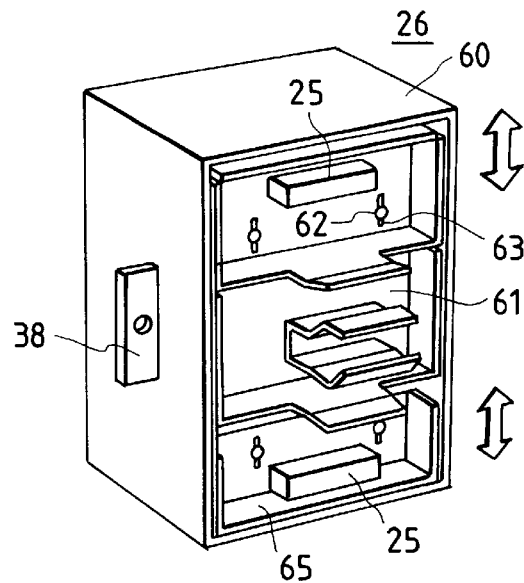
FIG. 9 is a perspective view of a connector box for connecting signal lines of the subordinate casings as shown in FIG. 5.
Figure 10:
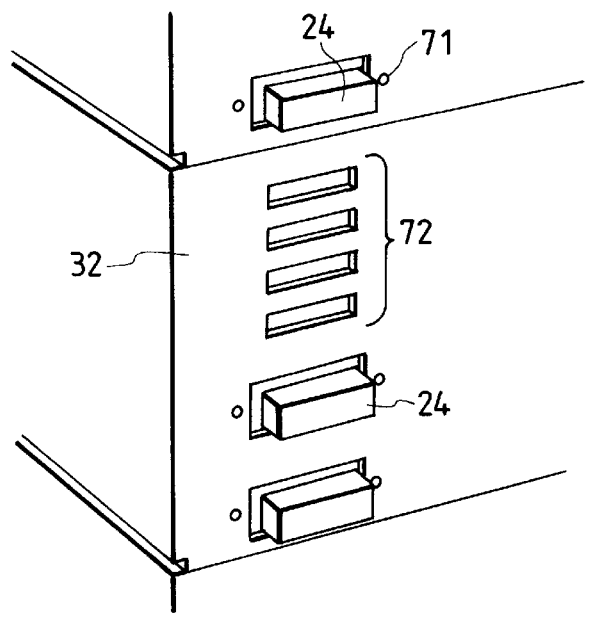
FIG. 10 is a perspective view of connectors mounted on the subordinate casing, corresponding to the connector box shown in FIG. 9.
Figure 11:
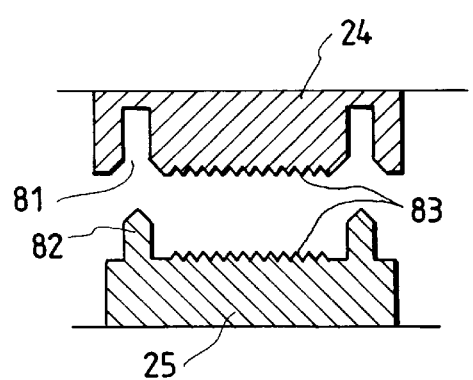
FIG. 11 is a sectional view of a connector mounted on the connector box shown in FIG. 9, and a corresponding connector mounted on the subordinate casing.
Figure 12A:
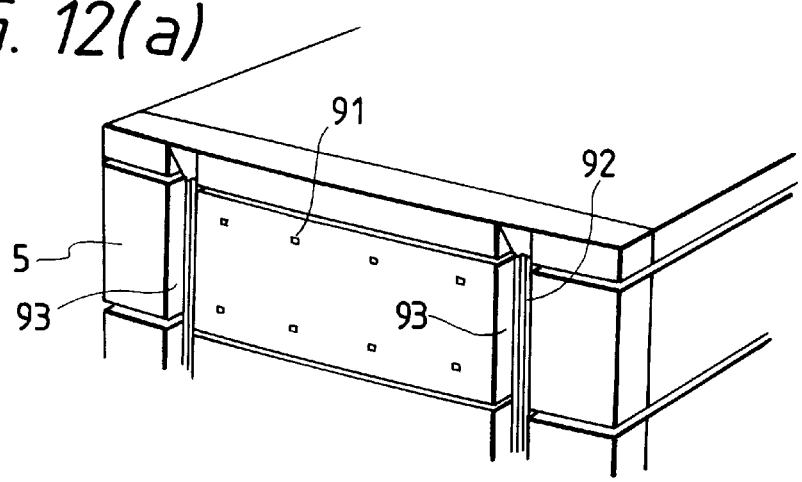
FIGS. 12(a), 12(b), 12(c) and 12(d) are a fragmentary perspective view, a fragmentary plan view, a fragmentary perspective view and a fragmentary sectional view, respectively, of a ventilating structure formed on the front cover of the subordinate casing of the casing of FIG. 4.
Figure 12B:
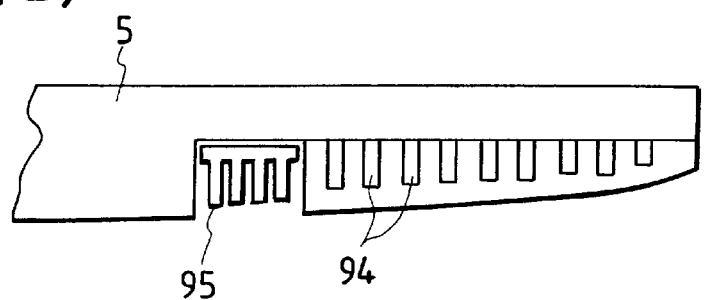
Figure 12C:
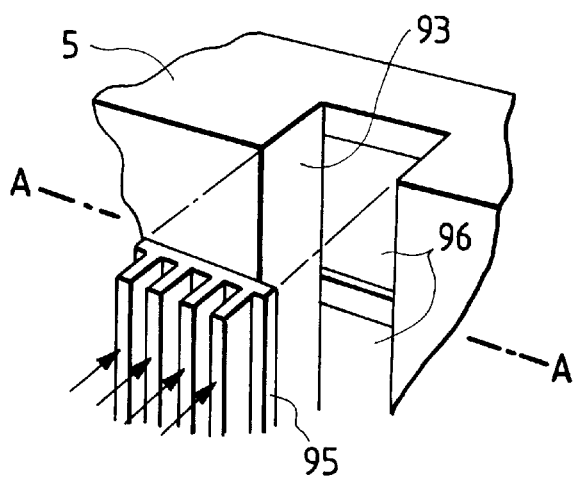
Figure 12D:
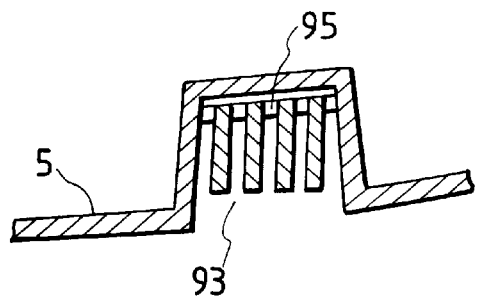
Figure 13:
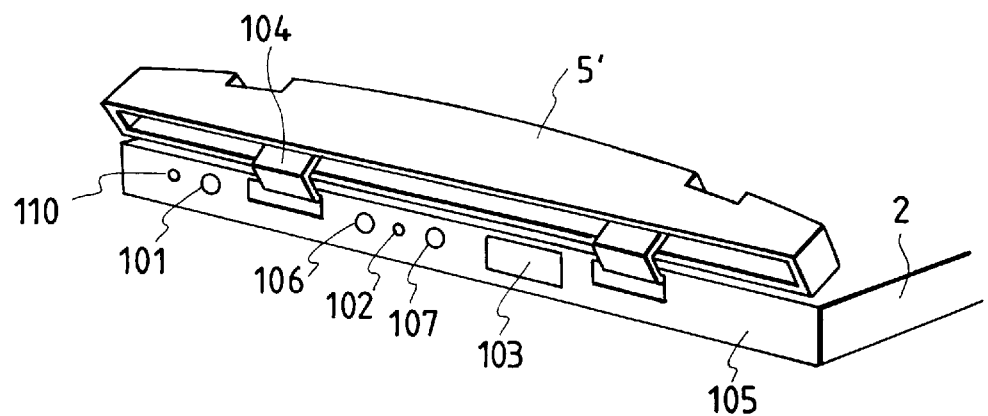
FIG. 13 is a perspective view of a front cover for the top subordinate casing of the casing of FIG. 4.

A casing in a preferred embodiment according to the present invention shown in FIG. 4 will be described hereinafter with reference to FIGS. 5 to 13. FIG. 5 is a perspective bottom view of one of a plurality of subordinate casings included in the casing of FIG. 4, FIG. 6 is a fragmentary sectional view of a connecting structure, by way of an example, for connecting the plurality of subordinate casings of the casing of FIG. 4, FIG. 7 is a side view of a latch mechanism for latching the front cover of the subordinate casing of the casing of FIG. 4, FIG. 8 is an exploded perspective rear view of the casing of FIG. 4, FIG. 9 is a perspective view of a connector box for connecting signal lines of the subordinate casings as shown in FIG. 5, FIG. 10 is a perspective view of connectors mounted on the subordinate casing, corresponding to the connector box shown in FIG. 9, FIG. 11 is a sectional view of connectors mounted on the connector box shown in FIG. 9, and the corresponding connectors mounted on the subordinate casing, FIG. 12(a), 12(b), 12(c) and 12(d) are a fragmentary perspective view, a fragmentary plan view, a fragmentary perspective view and a fragmentary sectional view, respectively, of a ventilating arrangement formed on the front cover of the subordinate casing of the casing of FIG. 4, and FIG. 13 is a perspective view of a front cover for the top subordinate casing of the casing of FIG. 4.

Referring to FIG. 4 a casing 200 comprises a first subordinate casing 2 provided with a first front cover 5', second subordinate casings 3 provided with second front covers 5, respectively, and a bottom case 4. The first subordinate casing 2, i.e., the top subordinate casing, contains an UP unit as mentioned with reference to FIGS. 2 and 3, and serves as a top subordinate casing of the casing 200. The bottom subordinate casing 3 contains a functional device, such as an uninterruptible power supply or the like. The second subordinate casings 3, i.e., intermediate subordinate casings, contains functional devices of different kind as mentioned with reference to FIG. 3. The front covers 5 and 5' are designed taking into consideration the aesthetic appearance of the casing 200. A rear cable cover 37 and connector boxes 26 are attached to the rear surface of each of the subordinate casings 2 and 3. The rear cable cover 37 and the connector boxes 26 are designed taking into consideration the aesthetic appearance of the casing 200. The separate second front covers 5 are attached to the second subordinate casings 3, respectively, and are provided in their front surfaces with a ventilating arrangement, which will be described later. The functional devices to be contained in the second subordinate casing 3 are general-purpose electronic devices available on the market and contained in cases designed for those electronic devices, respectively. The functional devices requiring cooling by forced ventilation are provided with a built-in fan. The front cover 5 is designed so as not to obstruct the cooling function of the functional device contained in the associated subordinate casing 3; that is, the front cover 5 is formed so as to allow ventilation.

Referring to FIG. 5 showing one of the subordinate casing 3 in a bottom view, the subordinate casing 3 has support boards 30 for supporting a functional device contained in the subordinate casing 3, forming opposite side sections of the bottom thereof and interconnected by lower connecting boards 28. Side panels 29 are attached to the outer side edges of the support boards 30, respectively. Upper connecting boards 27 are joined to the front and the rear end of the upper edges of the side panels 29 so as to correspond to the lower connecting boards 28. The subordinate casing 3 has a shape substantially resembling a box. A support board reinforcement 33 having a cross section of a shape substantially resembling the letter L is formed integrally with each support board 30 to reinforce the support board 30. The support board reinforcement 33 may be a separate member attached to the support board 30. The support board reinforcement 33 serves also as a means for protecting projecting parts, such as subordinate casing connecting hooks 21 which will be described later, from deformation when the subordinate casing 3 is placed on the floor during the assembly of the casing 200. The support board reinforcement 33 is formed in a height necessary to space the heads of screws fastening a general hardware 6, such as a general electronic device, to the subordinate casing 3, and the subordinate casing connecting hooks 21 attached to the support boards 30 from the surface of the floor so that the surface of the floor may not be damaged by the heads of the screws and the subordinate casing connecting hooks 21 may not be deformed when the subordinate casing 3 is placed on the floor. The general hardware 6, such as a general electronic device, is fastened to the support boards 30 with screws or the like. Front cover catches 35 for holding the front cover 5 on the side panels 29 are provided on front portions of the side panels 29, and the front cover 5 is provided with front cover stays 34 at positions thereon corresponding to the front cover catches 35. Whereas the components of the subordinate casing 3 is made from a metal, the front cover 5 is made from a resin or the like and has a gently curved front surface designed to secure a necessary strength and to provide the front cover 5 with satisfactory aesthetic appearance. The front cover 5 is provided with air inlets 36, such as slits or small square openings. The arrangement and shape of the air inlets 36 of the front cover 5 are determined, taking into consideration the function and the aesthetic effect of the air inlets 36, which will more specifically be described later. The subordinate casing connecting hooks 21 are attached to the front and rear end portions of the support boards 30. The positions of the subordinate casing connecting hooks 21 corresponds to the upper connecting boards 27 of the underlying subordinate casing 3. The upper connecting boards 27 are provided with openings 22 at positions corresponding to the subordinate casing connecting hooks 21 of the overlying subordinate casing 3. FIG. 6 shows the engagement of the subordinate casing connecting hook 21 attached to the support board 30 of the overlying subordinate casing 3 with the opening 22 of the upper connecting board 27 of the underlying subordinate casing 3. FIG. 7 shows the relation between the front cover stay 34 of the front cover 5 and the corresponding front cover catch 35 of the subordinate casing 3. The front cover stays 34 of the front covers 5 and the corresponding front cover catches 35 are engaged to attach the front cover 5 to the subordinate casing 3. The front cover catches 35 of the front subordinate casing 3 are of a well-known construction formed by processing a spring connector of a metal or a plastic material so as to clasp the front cover stay 34.

As is obvious from FIG. 5, when putting the functional device in and taking the same out from the subordinate casing 3 through the open front end of the subordinate casing, the front cover 5 covering the open front end of the subordinate casing is removed from the subordinate casing 3.

A method of stacking the subordinate casings 2 and 3 will specifically be described with reference to FIG. 8 showing the casing 200 in an exploded perspective rear view. As explained previously with reference to FIG. 5, each of the subordinate casings 2 and 3 is formed in the shape of a box by assembling the two side panels 29, two support boards 30, the two upper connecting boards 27 interconnecting the upper ends of the front and the rear end portions of the side panels 29, and the two lower connecting boards 28 interconnecting the lower ends of the front and the rear end portions of the side panels 29. Only the first subordinate casing 2 as the top subordinate casing of the casing 200 constructed by stacking the subordinate casings 2 and 3 is provided with a subordinate casing top cover 20. The two adjacent subordinate casings are connected by the engagement of the subordinate casing connecting hooks 21 and the openings 22. The lower connecting boards 28 of the upper one of the adjacent subordinate casings and the upper connecting boards 27 of the lower one of the adjacent subordinate casings are fastened together with screws or the like to prevent the stacked subordinate casings 2 and 3 from slipping out of place.

Each of rear boards 32 on the opposite sides of the rear surface of each of the subordinate casings 2 and 3 is provided with two connectors 24 for connecting the functional device contained in the corresponding subordinate casing to those contained in the subordinate casings respectively overlying and underlying the corresponding subordinate casing by signal lines. The each of the rear boards 32 of the top subordinate casing and the bottom subordinate casing is provided with one connector 24, in the subordinate casing, the two connectors 24 are connected in parallel to the functional device contained in the corresponding subordinate casing. One of the connectors 24 of one subordinate casing and one of the connectors 24 of another subordinate casing are connected in parallel to a connector 25 placed together with wiring lines in a connector box 26. Therefore, all the subordinate casings have common signal lines connected by the connectors 24 and 25. The connectors 24 and 25 are provided with a sufficiently large number of conductors regardless of the type of the functional devices contained in the subordinate casings. When the connectors 24 and 25 are general-purpose connectors each provided with a sufficiently large number of conductors, common signal lines are connected to all the subordinate casings, and each subordinate casing uses selectively only the signal lines required by the functional device contained therein. The connectors 24 and 25 disposed on the right and the left rear boards 32 may be used not only for connecting the signal lines but also connecting, for example, power lines. If the connectors 24 and 25 is used for connecting both signal lines and power lines, measures must be taken to avoid the influence of noise generated in the power lines on the signal lines. When separating power lines from those connected in the connector box 26, it is desirable to extend power cables connected to the functional devices contained in the subordinate casings through a space defined by the inner surface of a rear cable cover 31 to the bottom subordinate casing and connect the power cables to an uninterruptible power supply contained in the bottom subordinate casing.

As mentioned previously, the subordinate casings of a plurality of types respectively having different heights are used, and the connector boxes 26 of a plurality of types provided with the connectors 25 spaced a plurality of different distances apart, respectively, are used according to the combination of the subordinate casings so that the connectors 25 of the connector box 26 coupled with the connectors 24 of the subordinate casing to connect the functional devices electrically. The positional alignment and coupling of the connectors 24 and 25 will specifically be described later.

The rear cable cover 31 is provided with a plurality of small openings, not shown in FIG. 8, for ventilation. The rear cable cover 31 is attached to rear cable cover catches 38 formed on the connector boxes 26 with screws or the like after attaching the connector boxes 26 to the subordinate casings. The rear cable covers 31 of different types, similarly to the connector boxes 26 of different types, are prepared for combinations of the subordinate casings of different heights. The rear surface of the casing 200 with the rear cable covers 31 attached to the connector boxes 26 is a flat surface with a vertical groove formed by stepped parts for the rear cable covers 31. In this embodiment, any cover corresponding to the rear cable cover 31 is not attached to the rear surface of the first subordinate casing 2, i.e., the top subordinate casing, a rear cable cover 37 is attached to the rear end of the first subordinate casing 2 to form the rear surface of the casing 200 in a neatly flat surface. A semicircular recess is formed in the middle portion of the rear wall of the rear cable cover 37 to extend the cable 205 shown in FIG. 1 through the same semicircular recess. When the rear cable covers 31 are attached to the connector boxes 26, a space is formed between the rear ends of the subordinate casings and the rear cable covers 31. This space is used for extending the signal lines connected to the functional devices contained in the subordinate casings to the bottom of the casing 200, extending power lines connecting the functional devices to the uninterruptible power supply contained in the bottom subordinate casing or containing surplus portions of the connector cables. Accordingly, when the casing 200 in the first embodiment of the present invention containing the functional devices of the computer network system is observed from behind, only the cables 205 and 206 (FIG. 1) extend from the top and the bottom subordinate casing, respectively.

As mentioned above, when the connector boxes 26 are attached to the subordinate casings, the subordinate casings are provided with the common signal lines connected by the connector boxes 26. Therefore, in the computer network system employing the casing 200 of the present invention, the functional device contained in an optional subordinate casing can be removed or a functional device can be added to an optional subordinate casing while the computer network system is in operation with the connector boxes 26 coupled with the connectors 24. In this embodiment, the work for connecting the functional devices by the connector cables, disconnecting the connector cables from the functional devices and changing the connection of the functional devices can easily be carried out simply by removing the rear cable covers 31.

Since the rear cable cover 31 is provided with the plurality of small openings for ventilation, it is desirable that the rear cable cover 31 has a large area. Therefore, it is desirable that the rear boards 32 of the subordinate casing are formed in the least possible width necessary for attaching the connectors 24 thereto.

Although the description of the rear cable cover 31 for the bottom subordinate casing has been omitted, the same subordinate casing is used always as the bottom subordinate casing regardless of the construction of the casing 200 as shown in FIG. 3 and hence a rear cable cover 31 suitable for such a subordinate casing may be prepared.

The general construction of the casing in the first embodiment according to the present invention has been described above. Details of the structure of the modular unit will specifically be described hereinafter.

FIG. 9 is a perspective view of the connector box 26 for connecting the signal lines of the subordinate casings, FIG. 10 is a perspective view of a connector holding structure formed on the subordinate casing to hold the connector box 26, and FIG. 11 is a sectional view of the connector mounted on the connector box 26 and the corresponding connector mounted on the subordinate casing, in which parts like or corresponding to those shown in FIG. 8 are designated by the same reference characters. Shown in FIGS. 9 to 11 are a body 60, spring connectors 61, screws 62, adjusting slots 63, connector panel 65, holes 71 for receiving screws therethrough, spring connector catches 72, guide holes 81, guide bars 82 and conductor arrays 83.

As shown in FIG. 9, the connector box 26 has the body 60, the four spring connectors 61, the connector panel 65 and the rear cable cover catches 38 to which the rear cable cover 31 is attached. The two connectors 25 are fastened to the connector panel 65 with the screws 62. Wiring lines for interconnecting the two connectors 25 is arranged on the inner surface of the connector panel 65 disposed in the housing 60. The connectors 25 are attached to the connector panel 65 with the screws 62 inserted in the adjusting slots 63. The vertical position of the connectors 25 can be adjusted by moving the screws 62 along the corresponding adjusting slots 63. Each connector 24 of the subordinate casing is fastened to the rear board 32 of the subordinate casing with screws inserted through the holes 71 as shown in FIG. 10. The diameter of the holes 71 is slightly larger than that of the screws, and hence the position of the connector 24 can be changed in a range corresponding to the difference between the respective diameters of the holes 71 and the screws.

The rear board 32 of the subordinate casing is provided with the spring connector catches 72 at positions respectively corresponding to the four spring connectors 61 to receive the four spring connectors 61 therethrough. As shown in FIG. 11, each connector 24 of the subordinate casing is provided with the guide holes 81, and each connector 25 of the connector box 26 is provided with the guide bars 82 respectively corresponding to the guide holes 81.

When joining together the connector box 26 and the subordinate casings by the connector holding structure thus constructed, the connector box 26 is positioned roughly relative to the subordinate casings so that the guide bars 82 of the connectors 25 are aligned with the guide holes 81 of the corresponding connectors 24 of the subordinate casings, and then the connector box 26 is pushed against the rear boards 32 of the subordinate casings. Consequently, the conductors of the conductor arrays 83 of the connectors 24 and 25 are connected, and the spring connectors 61 are inserted into the spring connector catches 72 to hold the connectors 25 in firm engagement with the connectors 24.

FIGS. 12(a) to 12(d) shows a ventilating structure formed on the front cover 5 of the subordinate casing of the casing 200. The air inlets formed in the front cover 5 will be described with reference to FIGS. 12(a) to 12(d).

As mentioned above, the front cover 5 is provided with the air inlets 36 resembling a square opening or a slit. As shown in FIG. 12(a), the air inlets 36 formed in the front cover 5 are dot air inlets 91 and slit air inlets 92. The front cover 5 is provided with grooves 93 at positions dividing the front cover into three sections with respect to the width. The middle section of the front cover 5 is provided with the plurality of dot air inlets 91, and the grooves 93 are provided with the slit air inlets 92. Stepped portions are formed in the lower surfaces of the opposite side sections of the front cover 5, and slit air inlets 94 are formed in the stepped portions. FIG. 12(b) is a bottom view of the stepped portion of each of the opposite side sections of the front cover 5 on the outer sides of the grooves 93. Air is sucked through the air inlets 94 formed in the lower surface of the front cover 5. Indicated at 95 is an air vent piece for the slit air inlets 92 formed in the groove 93. FIGS. 12(c) and 12(d) shown the relation between the front cover 5, the groove 93 and the air vent piece 95. FIG. 12(c) is a view of assistance in explaining a method assembling the air inlet piece 95 and the front cover 5 and FIG. 12(d) is a sectional view taken on line A—A in FIG. 12(c). The air vent piece 95 has a base plate and elongate fins formed on the base plate, and is provided with slit like openings in portions between the fins. The air inlet piece 95 and the front cover 5 are formed separately, and the air vent piece 95 is fitted in the groove 93 as indicated by alternate long and short dash lines in FIG. 12(c). A vent hole 96 is formed in the bottom of the groove 93. The vent hole 96 is formed in the largest possible size that will not reduce the strength of the front cover 5. Air currents as indicated by arrows in FIG. 12(c) can be produced through the slitlike openings of the air vent piece 95, and the vent holes 96 of the front cover 5. It is desirable from the aesthetic point of view that the air vent piece 95 is sunk by an appropriate depth beneath the surface of the front cover 5 as shown in FIG. 12(d). In FIG. 12(d), all the slit like openings of the air vent piece 95 look as if they are closed because the FIG. 12(d) is a sectional view taken on line extending across a portion of the front cover 5 in which the vent holes 96 are not formed as shown in FIG. 12(c). If the cross section is taken along a line extending across a portion of the front cover in which the vent holes 97 are formed, portions of the front cover 5 closing the slit like openings do not appear on the cross section. The width and the depth of the grooves 93, and the shape and the dimensions of the air vent pieces 95 may optionally be determined. In this embodiment, the width of the grooves 93 is 20 mm, the respective widths of the slit like openings and the fins are 2 mm, and the distance between the surfaces of the front cover 5 and the air vent piece 95 is 16 mm.

The size and arrangement of the air inlets 91 on the front cover 5, and the size and positions of the grooves 93 provided with the slit air inlets 92 are determined so that air supply to the functional device contained in the subordinate casing may not be hindered, the air inlets 91 may not easily be identified, and the front cover 5 may have an aesthetically satisfactory appearance.

FIG. 13 is a perspective view of a front cover, by way of example, for the top subordinate casing, i.e., the first subordinate casing 2. As shown in FIG. 2, the top subordinate casing does not contain any one of the component functional devices of the computer network system, but contains a functional device which carries out simple operations for switching the functional devices contained in the other subordinate casings, and turning on and off the uninterruptible power supply. Therefore, it is desirable to provide the top subordinate casing with a control panel provided with switches for switching the functional devices, indicator lamps for indicating the operating condition of the functional devices, and the like to be operated by the operator. The front cover 5' is supported by hinges 104 on the first subordinate casing 2 so as to be turned upward relative to the first subordinate casing 2. When the front cover 5' is turned upward, a control panel 105 disposed at the front end of the first subordinate casing 2 is exposed. The control panel 105 shown in FIG. 13 is provided with LEDs 101, 106 and 107, a main switch 110, a switching switch 102 and a clock 103. When starting the computer network system, the main switch 110 is operated to turn on the power supply, such as the uninterruptible power supply. When the power supply is turned on, the LED 101 is turned on. The LED 106 is turned on if the switching switch 102 selects the upper personal computer PC, and the LED 107 is turned on if the switching switch 102 selects the lower personal computer PC.

The front cover 5', similarly to the front covers 5 of the second subordinate casings 3, may be detachable. However, since the first subordinate casing 2 contains only printed wiring boards provided with only simple, auxiliary control circuits as mentioned above, has the low height and is provided with the control panel 105 provided with operating devices including the switching switch 102, it is desirable to support the front cover 5' by the hinges 104 on the first subordinate casing 2 to facilitate the operation of the control panel 105. The first subordinate casing 2 may be provided with a drawer for containing a personal computer of a book type of a pen type therein to use the personal computer contained therein for operating and controlling the computer network system. If the computer network system is provided with the personal computer contained in the drawer, the display 202 and the keyboard 203 shown in FIG. 1 may be omitted.

Figure 14A:
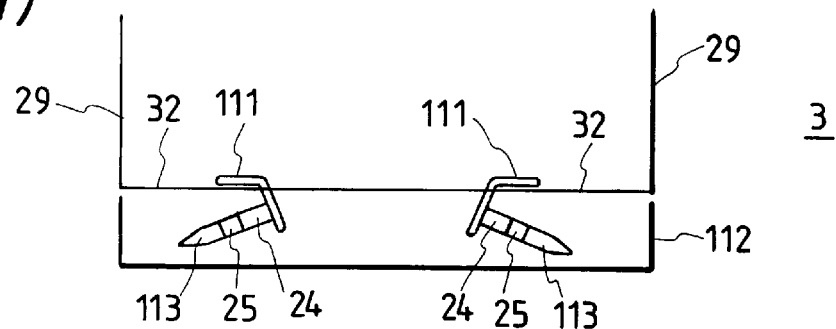
FIGS. 14(a) and 14(b) are a schematic fragmentary sectional view and a rear view, respectively, showing a method of connecting the signal lines of the subordinate casings by connector cables instead of by the connector boxes.
Figure 14B:
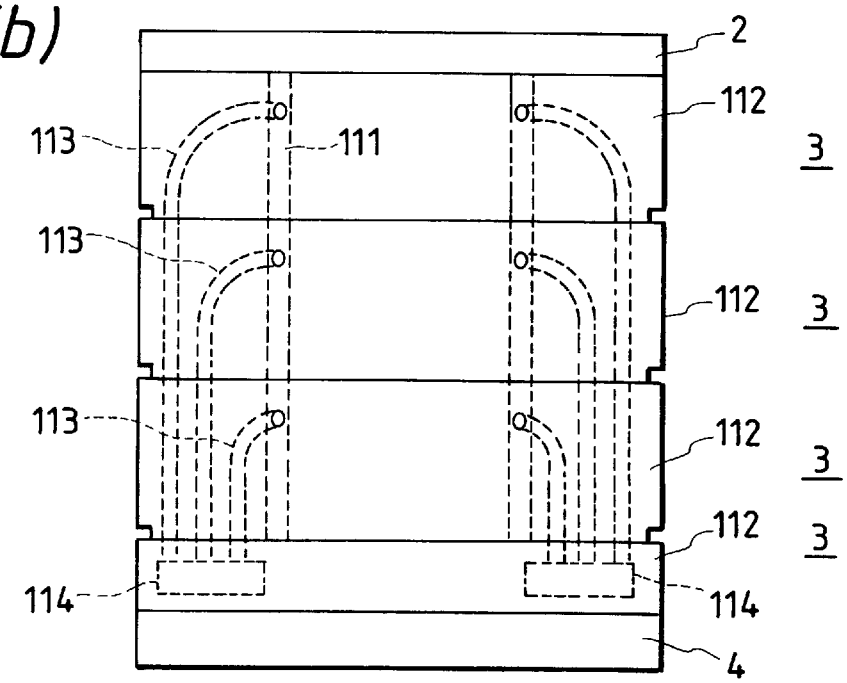

The foregoing embodiment of the present invention is subject to various modifications. Some modifications of the foregoing embodiment will briefly be described with reference to the drawings. FIGS. 14(a) and 14(b) are a schematic fragmentary sectional view and a back view, respectively, of connector cables employed for connecting the signal lines of the subordinate casings instead of the connector boxes 26 shown in FIG. 9. The functional devices are connected by the connector cables instead of the connector boxes 26. As shown in FIG. 14(a), a connector panel 111 is supported obliquely or sideways on each rear board 32, the connector 24 is held on the connector panel 111, and the connector 25 connected to a connector cable 113 is coupled with the connector 24. A rear cable cover 112 capable of entirely covering the rear surface of the subordinate casing including the connector boxes 26 shown in FIG. 8 is attached, instead of the rear cable cover 31 shown in FIG. 8, to the rear end of the subordinate casing to cover the connector panels 111 and the connector cables 113 entirely with the rear cable cover 112. The depth of the subordinate casing provided with the connectors 24 thus supported obliquely or sideways is smaller than that of the subordinate casing provided with the connector boxes 26. In FIG. 14(b), broken lines indicate the connector cables 113. All the connector cables 113 extending from the connectors 25 are extended to the bottom subordinate casing 3. Similarly, connector cables 113 are extended from the first subordinate casing 2 to the bottom subordinate casing 3. The bottom subordinate casing 3 is provided with connector arrays 114 to which the connector cables 113 from the subordinate casings 3 are connected. The connector arrays 114, similarly to the connector boxes 26 shown in FIG. 8, are connected to common wiring lines. Therefore, all the subordinate casings have common signal lines and the functional devices contained in the subordinate casings can be changed while the computer network system is in operation if the wiring lines are connected selectively to each connector cable 113 from each subordinate casing 3.

Figure 15A:
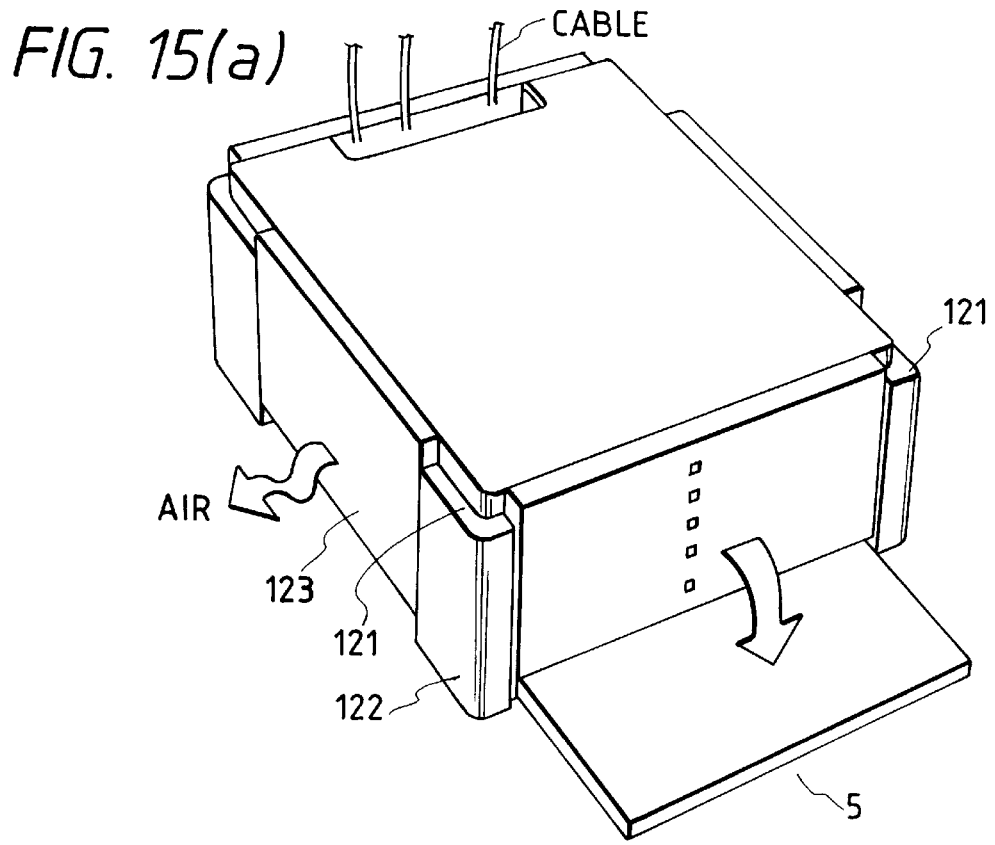
FIGS. 15(a) and 15(b) are perspective views of a subordinate casing and a casing in a second embodiment according to the present invention formed by stacking subordinate casings like that shown in FIG. 15(a), respectively.
Figure 15B:
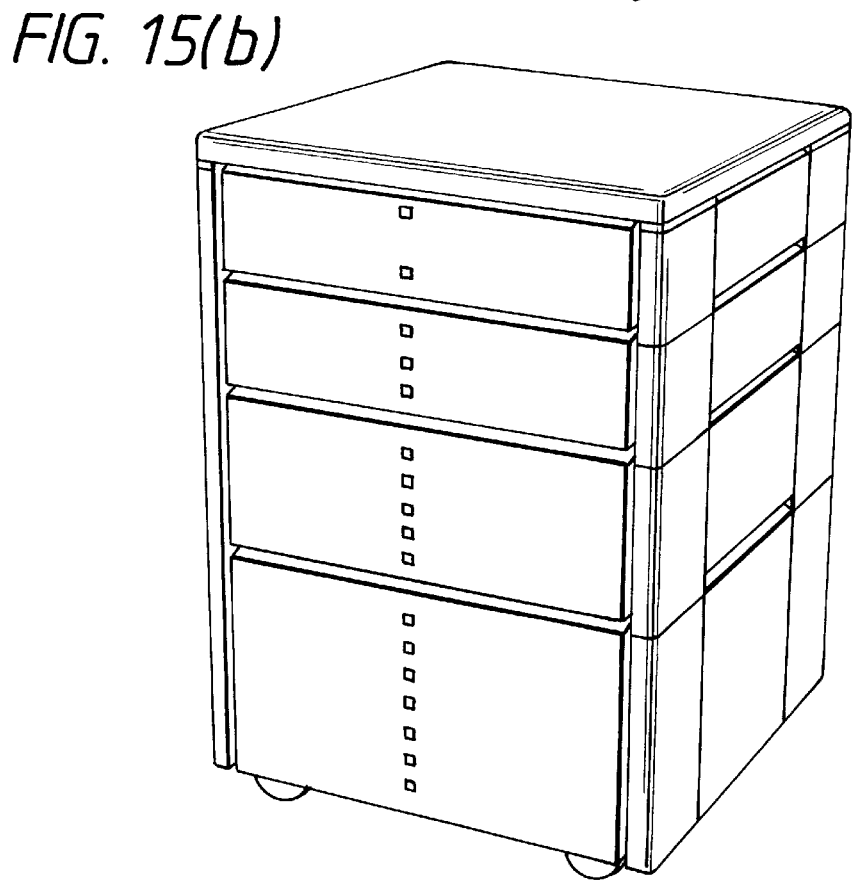

FIG. 15(a) is a perspective view of a subordinate casing included in a casing in a second embodiment according to the present invention and FIG. 15(b) is a perspective view of the casing in the second embodiment constructed by stacking subordinate casings like that shown in FIG. 15(a). Referring to FIG. 15(a), the subordinate casing is provided with concaves 121 in the four corners of its upper surface, and feet 122 of a shape complementary to the concaves 121 at positions corresponding to those of the concaves 121 on its bottom surface. When stacking a plurality of subordinate casings like that shown in FIG. 15(a) to construct a casing as shown in FIG. 15(b), the feet 122 of the overlying subordinate casing are fitted in the concaves 121 of the underlying subordinate casing.

The subordinate casing shown in FIG. 15(a) is provided with vent holes in its side panels 123. The interior of the subordinate casing is ventilated through the vent holes formed in the side panels 123 to cool an electronic device contained in the subordinate casing. The interior of the subordinate casing, similarly to that of the subordinate casing in the foregoing embodiment, may be ventilated through a front cover 5 and a rear cable cover 31 attached thereto. The front cover 5 may be detachably attached to the subordinate casing or may be supported on a lower portion of the front surface of the subordinate casing by hinges so as to be turned downward. Although the subordinate casing may be provided with connectors on its rear surface and the connectors of the adjacent subordinate casings may be connected by the connector box, the subordinate casing shown in FIG. 15(a) uses connector cables like that described with reference to FIGS. 14(a) and 14(b).

Figure 16A:
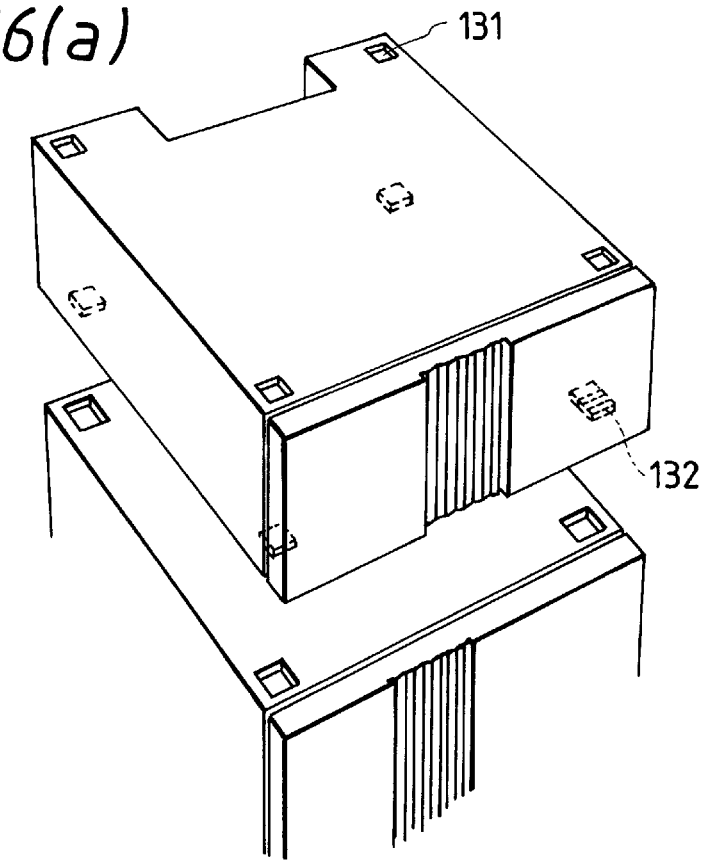
FIGS. 16(a) and 16(b) are perspective views of a subordinate casing and a casing in a third embodiment according to the present invention formed by stacking subordinate casings like that shown in FIG. 16(a), respectively.
Figure 16B:
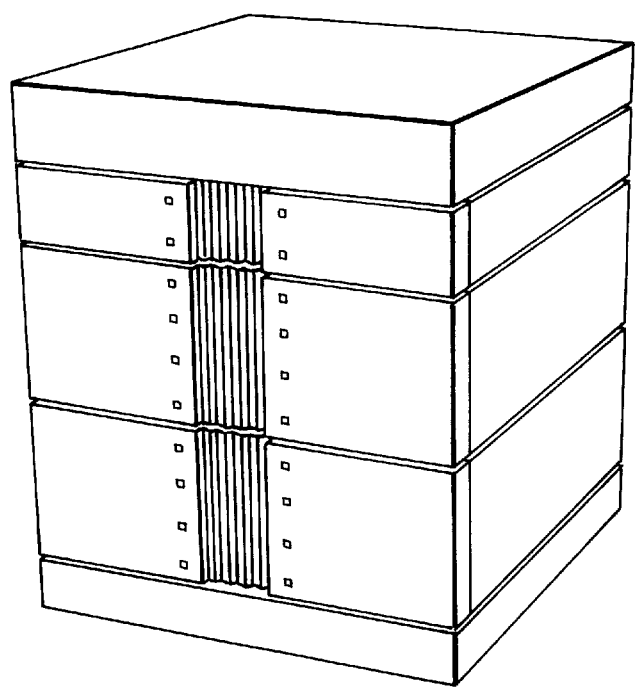

FIG. 16(a) is a perspective view of a subordinate casing included in a casing in a third embodiment according to the present invention and FIG. 16(b) is a perspective view of the casing in the third embodiment constructed by stacking subordinate casings like that shown in FIG. 16(a). Referring to FIG. 16(a), the subordinate casing is provided with concaves 131 in the four corners of its upper surface, and feet 132 of a shape complementary to the concaves 131 at positions corresponding to those of the concaves 131 on its lower surface. When stacking a plurality of subordinate casings like that shown in FIG. 16(a) to construct a casing as shown in FIG. 16(b), the feet 132 of the overlying subordinate casing are fitted in the concaves 131 of the underlying subordinate casing. The subordinate casing shown in FIG. 16(a) may be the same in other respects as that shown in FIG. 15(a).

The subordinate casings shown in FIGS. 15(a) and 16(a) may be provided with a necessary number of connectors arranged on their upper and lower surfaces so that the connectors of the adjacent subordinate casings are coupled to interconnect functional devices contained in the subordinate casings when the subordinate casings are stacked. The casing thus constructed, similarly to the casing employing the connector boxes 26, may be provided with a properly excessive number of wiring lines to enable the casing to deal easily with the change of the functional devices contained in the subordinate casings.

Figure 17A:
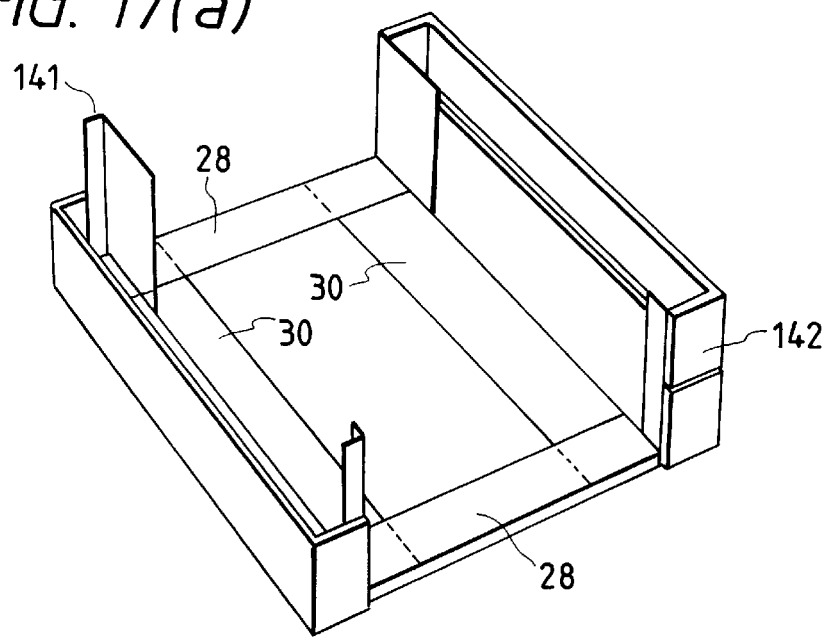
FIGS. 17(a), 17(b) and 17(c) are a fragmentary perspective view of a subordinate casing included in a casing in a fourth embodiment according to the present invention, a fragmentary perspective view of side panels of the subordinate casings of the casing, and the casing formed by stacking subordinate casings like that shown in FIG. 17(a), respectively.
Figure 17B:
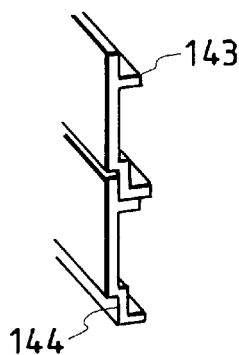
Figure 17C:
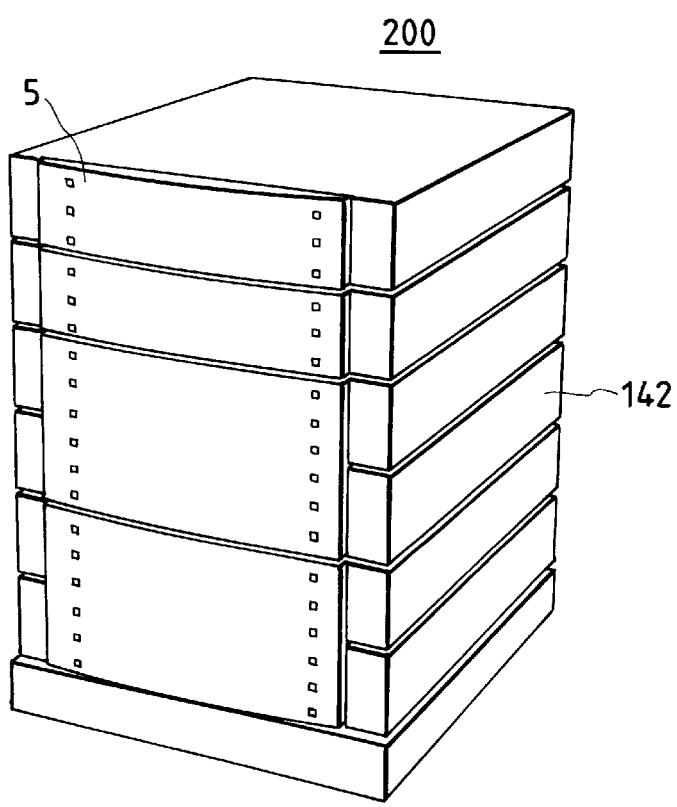

FIGS. 17(a), 17(b) and 17(c) are a fragmentary perspective view of a subordinate casing included in a casing in a fourth embodiment according to the present invention, a fragmentary perspective view of side plates of the subordinate casings of the casing, and the casing formed by stacking subordinate casings like that shown in FIG. 17(a), respectively. This casing is designed to use side plates of the same height regardless of the height of the subordinate casings. Referring to FIG. 17(a), the subordinate casing has four pillars 141 of an L-shaped cross section formed by bending a plate and having a height equal to that of the subordinate casing in its four corners, and side plate modules 142 attached to the pillars 141. Each side plate module 142 is provided with a convex part 143 formed near its upper edge, and a dented part 144 formed on its lower edge. When the side plate modules 142 are stacked one on top of the other, the dented part 144 of the upper side panel constructive piece 142 rests on the convex part 143 of the lower side panel constructive piece 142. The side panel constructive piece 142 has a standard height equal to the greatest common divisor of the respective heights of standard subordinate casings. The standard height of the side plate module is, for example, 25 mm, and the respective heights of the standard subordinate casings are integral multiples of the standard height. The plurality of side panel constructive pieces 142 are stacked to construct a side wall of a subordinate casing of a desired standard height.

As is obvious from FIG. 17(c), it is known that the casing 200 is constructed by stacking subordinate casings respectively having different heights when the casing 200 is seen from the side of the front surface thereof, and the casing 200 looks as if the same is constructed by stacking subordinate casings of the same standard height when the casing 200 is seen from the side of the side surface thereof. Generally, the casing 200 has a morphology of an excellent design.

The casing 200 shown in FIG. 17(c) is the same as the foregoing casings in accordance with the present invention in other respects including a structure for stacking the subordinate casings, a structure for electrically connecting the subordinate casings and a ventilating structure for cooling the functional devices contained in the subordinate casings. In FIG. 17(a), only lower connecting boards 28 and support boards 30 corresponding to those of the subordinate casing shown in FIG. 8.

Figure 18:
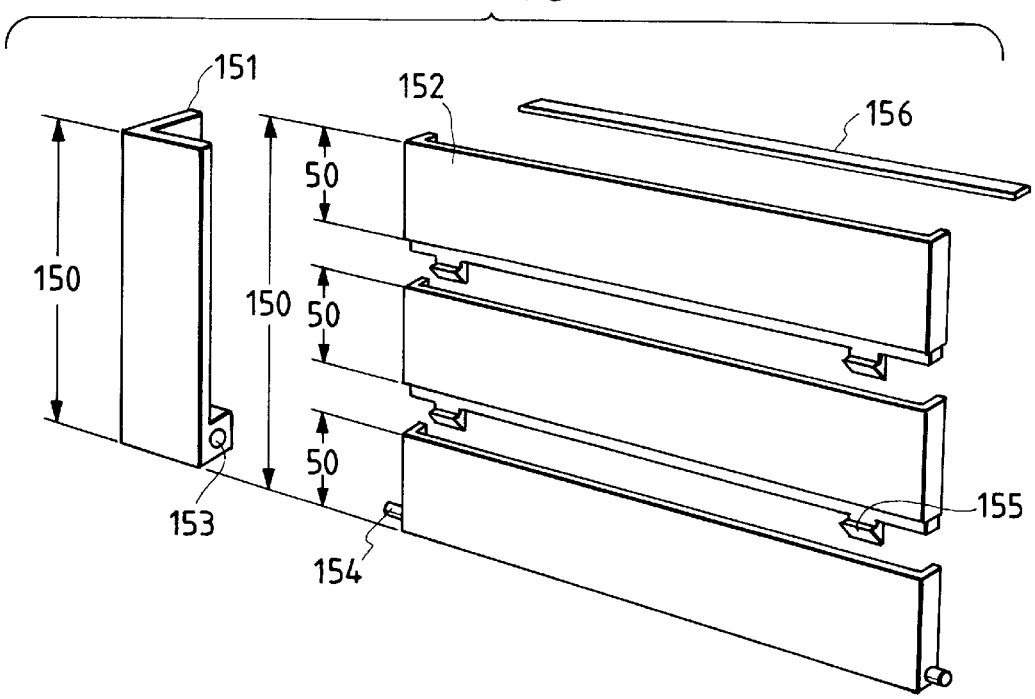
FIG. 18 is an exploded perspective view of a side wall of a subordinate casing for a casing in a fifth embodiment according to the present invention, constructed by stacking side panels one on top of another.

FIG. 18 is an exploded perspective view of a side wall of a subordinate casing for a casing in a fifth embodiment according to the present invention, constructed by stacking side panels one on top of another. The side panels are connected by a connecting structure different from that illustrated in FIG. 17(b) so as to be able to be turned downward on their lower edges. End piece pillars 151 similar to those shown in FIG. 17(a) are provided in their lower portions with concaves 153, and a bottom side panel constructive piece 152 is provided in the lower end portions of the opposite end surfaces thereof with projections 154 to be fitted in the concaves 153, respectively. Each of side panel constructive pieces 152 other than the bottom side panel constructive piece 152, not provided with any projections 154 is provided with connectors 155 on the lower edge thereof. When the side panel constructive pieces 152 are stacked one on top of another, the connectors 155 of the overlying side panel constructive piece 152 engage with the upper edge of the underlying side panel constructive piece 152. A cap 156 is attached to the upper edge of a top side plate module 152. The cap 156 may be formed integrally with the top side plate module 152.

In this embodiment shown in FIG. 18, the subordinate casing is 150 mm in height and the side plate module 152 is 50 mm in height pillars of a plurality of types having different heights are prepared, and a desired number of side panel constructive pieces 152 are stacked to construct a subordinate casing of a desired height. If it is desired to construct a subordinate casing having gaps in its side walls, side panel constructive pieces of a slightly smaller width may be used. When the casing of this embodiment is constructed by stacking subordinate casings like that shown in FIG. 18, the casing has the same effect as that previously described with reference to FIG. 17(c). The side panel constructive pieces illustrated in FIGS. 17(a) to 17(c) and 18 may be provided with vent holes for ventilation to cool the functional devices contained in the subordinate casings.

Figure 19:
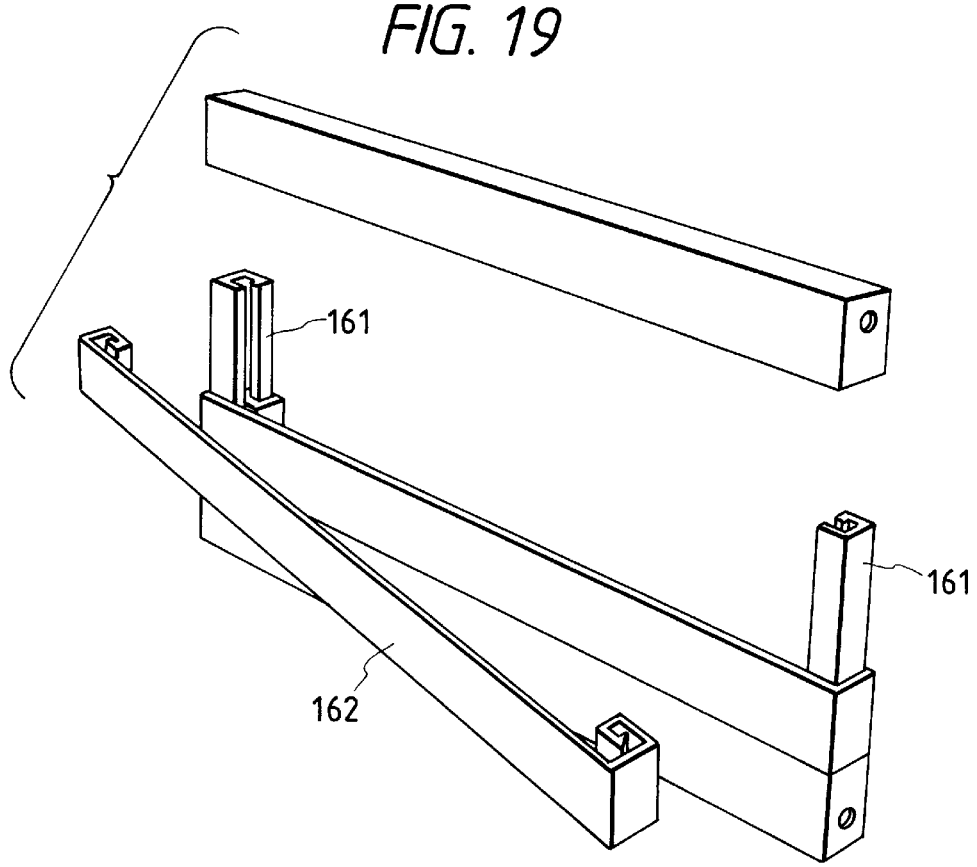
FIG. 19 is an exploded perspective view of a side wall of a subordinate casing for constructing a casing in a sixth embodiment according to the present invention.

FIG. 19 is an exploded perspective view of a side wall of a subordinate casing for constructing a casing in a sixth embodiment according to the present invention. As shown in FIG. 19, side panel constructive pieces 162 are put on a frame 161 formed from solid-drawn shapes or the like to construct a side wall of a subordinate casing. The side wall thus constructed is attached to pillars like those disposed in the four corners of the subordinate casing described with reference to FIG. 17(a) or is pivotally supported on pillars like those shown in FIG. 18 so as to be able to turn about an axis.

The conception of using a plurality of side panel constructive pieces of a small standard height applies to the front cover.

Figure 20:
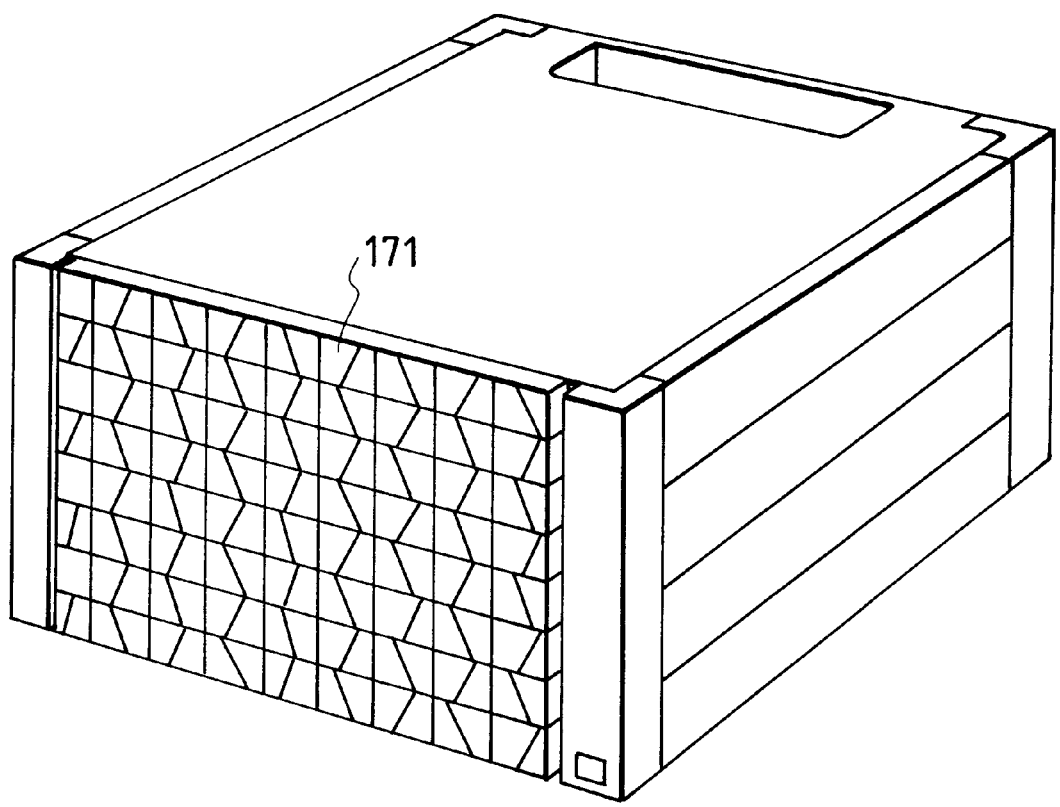
FIG. 20 is a perspective view of a subordinate casing provided with a front cover consisting of a plurality of front panel modular pieces of a small height.

FIG. 20 is a perspective view of a subordinate casing provided with a front cover consisting of a plurality of front panel modular pieces of a small height. A front cover 5 for a subordinate casing of 200 mm in height is constructed by stacking eight front panel modular pieces 171 of 25 mm in height. Each of the side walls of the subordinate casing is constructed by stacking four side panel constructive pieces of 50 mm in height provided with vent holes. A pattern is formed on the front surfaces of the modular front plates of the front cover so that the front cover looks as if the same is a unitary panel. If a casing is constructed by stacking subordinate casings like that shown in FIG. 20, the casing looks as if the same is a unitary case.

The casing in each of the foregoing embodiments of the present invention for containing the functional devices of a computer network system is constructed by stacking a plurality of subordinate casings. According to the present invention, pillars may be combined with a casing constructed by stacking a plurality of subordinate casings to enhance the unitary appearance of the casing.

Although the casings in the foregoing embodiments of the present invention include the bottom case 4, the base may be omitted and the bottom subordinate casing may be used also as the base. If the bottom subordinate casing is used as the base, the bottom subordinate casing is provided with feet which support the bottom subordinate casing so that the height of the bottom subordinate casing from the floor is equal to that of the bottom subordinate casing not provided with any feet and supported on the bottom case 4 to construct the casing in a height equal to that of the casing including the bottom case 4.

As is apparent from the foregoing description, according to the present invention, the casing is capable of quickly dealing with various computer network systems of different configurations by containing all the functional devices of the computer network system including existing personal computers, workstations, file storage devices, a communication device and an uninterruptible power supply therein and interconnecting the functional devices in an integral system. Accordingly, the present invention suppresses costs for developing a computer network system, provides an inexpensive computer network system, facilitates the functional improvement of an existing computer network system, and maintains the desired functions and reliability of the computer network system for an extended period of use.

We claim:

1. A casing constructed by stacking a plurality of individual subordinate casings each of which includes at least one functional device, wherein at least two functional devices thereof execute different functions, with each subordinate casing comprising a front cover, side walls, connector boxes and at least one removable rear cable cover provided separately from said connector boxes;

wherein the functional devices in the individual subordinate casings are interconnected electrically by a plurality of common signal lines contained in said connector boxes regardless of a number of signal lines required by each of said functional devices;

wherein said at least one removable rear cable cover covers another wiring path different from said connector boxes, which wiring path is adapted to allow wires other than said common signal lines to traverse said subordinate casings.

2. The casing according to claim 1, wherein each of the subordinate casings is provided with rear boards in the opposite side portions of a rear end surface thereof covered by the rear cable cover, at least one of the rear boards of each of the top and the bottom subordinate casing is provided with one connector for connecting the signal lines required by the functional device, and at least one of the rear boards of each of the intermediate subordinate casings between the top and the bottom subordinate casing is provided with two connectors for connecting the signal lines required by the functional device, one of the connectors of the overlying subordinate casing and one of the connectors of the underlying subordinate casing are interconnected by a connector box provided with connectors and a necessary number of signal lines required by the casing, and the rear cable cover is extended between the connector boxes.

3. The casing according to claim 2, wherein the front cover of each subordinate casing is provided with air inlets, and spaces each defined by the rear cable cover and the rear boards of each of the subordinate casings excluding the top and the bottom subordinate casing are connected to form a ventilating means.

4. The casing according to claim 1, wherein each subordinate casing is provided with rear boards in the opposite sides of the rear end surface thereof, each of the subordinate casings excluding the bottom subordinate casing is provided on the rear boards thereof with connectors for connecting signal lines required by the functional device, the bottom subordinate casing is provided with a connector array having a number of signal lines required by the casing, the connectors of the subordinate casings are connected to the connector array by cables, and the rear cable covers cover the rear surfaces of the corresponding subordinate casings.

5. The casing according to claim 4, wherein the front cover of each of the subordinate casings is provided with air inlets, and spaces each defined by the rear cable cover and the rear boards of the subordinate casings excluding at least the top and the bottom subordinate casing are connected to form a ventilating means.

6. A casing constructed by stacking a plurality of individual subordinate casings each of which includes at least one functional device, wherein at least two functional devices thereof execute different functions, with each subordinate casing comprising a front cover, side walls, connector boxes and at least one removable rear cable cover provided separately from said connector boxes;

wherein each of said functional devices is interconnected electrically by a number of common signal lines contained in said connector boxes regardless of a number of signal lines required by each of said functional devices;

wherein said at least one removable rear cable cover covers another wiring path different from said connector boxes, which wiring path is adapted to allow wires other than said common signal lines to traverse said subordinate casings;

wherein the lower surface of the top subordinate casing is in contact with the upper surface of the underlying subordinate casing, the upper surface of the bottom subordinate casing is in contact with the lower surface of the overlying subordinate casing, the upper and the lower surface of each of the intermediate subordinate casings between the top and the bottom subordinate casing are in contact with the lower surface of the overlying subordinate casing and the upper surface of the underlying subordinate casing, respectively, portions of the contact surfaces in contact with each other are engaged with each other, and the front covers of the subordinate casings excluding at least the top subordinate casing can individually be removed from or attached to the side walls while the casing is in use.

7. The casing according to claim 6, wherein the individual subordinate casings are interconnected electrically by a number of signal lines required by the casing regardless of a number of signal lines required by functional devices contained in the plurality of individual subordinate casings.

8. The casing according to claim 7, wherein each of the subordinate casings is provided with rear boards in the opposite sides of a rear end surface thereof covered by the rear cable cover, one of the rear boards is provided with connectors for connecting signal lines required by the functional device, one of the connectors of the overlying subordinate casing and one of the connectors of the underlying subordinate casing are interconnected by a connector box provided with connectors and a necessary number of signal lines required by the casing, and the rear cable cover is extended between the connector boxes.

9. The casing according to claim 8, wherein the front cover of each subordinate casing is provided with air inlets, and spaces each defined by the rear cable cover and the rear boards of each of the subordinate casings excluding the top and the bottom subordinate casing are connected to form a ventilating means.

10. The casing according to claim 6, wherein each subordinate casing is provided with rear boards in the opposite sides of the rear end surface thereof, each of the subordinate casings excluding the bottom subordinate casing is provided on the rear boards thereof with connectors for connecting signal lines required by the functional device, the bottom subordinate casing is provided with a connector array having a number of signal lines required by the casing, the connectors of the subordinate casings are connected to the connector array by cables, and the rear cable covers cover the rear surfaces of the corresponding subordinate casings.

11. The casing according to claim 10, wherein the front cover of each of the subordinate casings is provided with air inlets, and spaces each defined by the rear cable cover and the rear boards of the subordinate casings excluding at least the top and the bottom subordinate casing are connected to form a ventilating means.

12. A computer for a computer network system employing a casing constructed by stacking a plurality of individual subordinate casings respectively containing necessary functional devices, at least two different functional devices contained different in differing subordinate casings and which execute mutually different functions, each of said subordinate casings comprising a front cover, side walls, connector boxes and at least one removable rear cable cover provided separately from said connector boxes;

wherein each of said functional devices is interconnected electrically by a number of common signal lines contained in said connector box regardless of a number of signal lines required by each of said functional devices;

wherein said at least one removable rear cable cover covers another wiring path different from said connector boxes, which wiring path is adapted to allow wires other than said common signal lines to traverse said subordinate casings;

wherein the top subordinate casing having a lower surface in contact with an upper surface of the underlying subordinate casing; the bottom subordinate casing having an upper surface in contact with a lower surface of the overlying subordinate casing, each of the intermediate subordinate casings between the top and the bottom subordinate casing having an upper surface and a lower surface in contact with the lower surface of the overlying subordinate casing and the upper surface of the underlying subordinate casing, respectively, portions of the contact surfaces in contact with each other being engaged with each other, and the front covers of the subordinate casings excluding at least the top subordinate casing being capable of being individually removed from or attached to the side walls while the casing is in use;

wherein a functional device for controlling functional devices contained in the subordinate casings other than the top subordinate casing is contained in the top subordinate casing, an uninterruptable power supply for supplying power to the functional devices contained in the subordinate casings other than the bottom subordinate casing is contained in the bottom subordinate casing, a display and a keyboard for operating the functional devices contained in the subordinate casings are disposed near the casing and connected electrically to the functional devices contained in the subordinate casings.

13. The computer according to claim 12, wherein the top subordinate casing of the casing is provided with a front cover supported thereon so as to be turned upward relative to the same, and a panel for operating and indicating the operation condition of a functional device contained therein.

14. The computer according to claim 12, wherein the subordinate casings are interconnected electrically by a number of signal lines required by the casing regardless of a number of signal lines required by a functional device contained in each of the subordinate casing.

15. The computer according to claim 14, wherein each of the subordinate casings is provided with rear board in the opposite side portions of the rear end surface thereof covered with the rear cable cover, one of the rear boards is provided with a connector for connecting the signal lines required by the functional device contained in the subordinate casing, one of the connectors of the overlying subordinate casing and one of the connectors of the underlying subordinate casing are interconnected by a connector box provided with connectors and a necessary number of signal lines required by the casing, and the rear cable cover is extended between the connector boxes.

16. The computer according to claim 15, wherein the front cover of each subordinate casing is provided with air inlets, and spaces each defined by the rear cable cover and the rear boards of each of the subordinate casings excluding the top and the bottom subordinate casing are connected to form a ventilating means.

17. The computer according to claim 14, wherein each subordinate casing is provided with rear boards in the opposite sides of the rear end surface thereof, each of the subordinate casings excluding the bottom subordinate casing is provided on the rear boards thereof with connectors for connecting signal lines required by the functional device, the bottom subordinate casing is provided with a connector array having a number of signal lines required by the casing, the connectors of the subordinate casings are connected to the connector array by cables, and the rear cable covers cover the rear surfaces of the corresponding subordinate casings.

18. The computer according to claim 17, wherein the front cover of each of the subordinate casings is provided with air inlets, and spaces each defined by the rear cable cover and the rear boards of the subordinate casings excluding at least the top and the bottom subordinate casing are connected to form a ventilating means.

19. A casing constructed by stacking a plurality of individual subordinate casings, each of which includes at least one functional device, and wherein at least two functional devices thereof execute mutually different functions, each individual subordinate casing comprising a front cover, side walls, connector boxes and at least one removable rear cable cover provided separately from said connector boxes;

wherein said each functional device in the individual subordinate casings is interconnected electrically by a plurality of common signal lines contained in said connector boxes regardless of a number of signal lines required by each of said functional devices;

wherein said at least one removable rear cable cover covers another wiring path different from said connector boxes, which wiring path is adapted to allow wires other than said common signal lines to traverse said subordinate casings; and wherein a height of said connector box corresponds to a height of said subordinate casing.

20. A casing constructed by stacking a plurality of individual subordinate casings, each of which includes at least one functional device, and wherein at least two functional devices thereof execute mutually different functions, each individual subordinate casing comprising a front cover, side walls, at least one removable rear cable cover, connector boxes separate from said at least one removable rear cable cover and which are placed on both sides of said rear cable cover;

wherein said each functional device in the individual subordinate casings is interconnected electrically by a plurality of common signal lines contained in said connector box regardless of a number of signal lines required by each of said functional devices; wherein said at least one removable rear cable cover covers another wiring path different from said connector boxes, which wiring path is adapted to allow wires other than said common signal lines to traverse said subordinate casings; and wherein a height of said connector box corresponds to a height of said subordinate casing and said rear cable cover is extended between both connector boxes so that the rear of casing is covered by said connector box and said rear cable cover.

21. A casing constructed by stacking a plurality of individual subordinate casings according to claim 19, wherein a power line for functional devices is contained one of connector boxes.

22. A casings constructed by stacking a plurality of individual subordinate casing according to claim 20, wherein a power line for functional devices is contained one of connector boxes.

23. A casing constructed by stacking a plurality of individual subordinate casings according to claim 19, wherein said rear cable cover is extended to said both connector boxes so that a gap is formed between said rear cable cover and rear of said functional device.

24. A casing constructed by stacking a plurality of individual subordinate casings according to claim 20, wherein said rear cable cover is extended to said both connector boxes so that a gap is formed between said rear cable cover and rear of said functional device.

\* \* \* \* \*